US012626751B2

(12) United States Patent

Simsek-Ege et al.

(10) Patent No.: US 12,626,751 B2

(45) Date of Patent: May 12, 2026

(54) MICROELECTRONIC DEVICES, AND RELATED MEMORY DEVICES AND ELECTRONIC SYSTEMS

(71) Applicant: Micron Technology, Inc., Boise, ID (US)

(72) Inventors: Fatma Arzum Simsek-Ege, Boise, ID (US); Beau D. Barry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 18/409,723

(22) Filed: Jan. 10, 2024

(65) Prior Publication Data

US 2024/0290375 A1 Aug. 29, 2024

Related U.S. Application Data

(60) Provisional application No. 63/486,778, filed on Feb. 24, 2023.

(51) Int. Cl.
*H10B 41/10* (2023.01)
*G11C 5/06* (2006.01)
(Continued)

(52) U.S. Cl.
CPC .......... *G11C 11/4091* (2013.01); *G11C 5/063* (2013.01); *G11C 11/4085* (2013.01); *G11C 11/4097* (2013.01)

(58) Field of Classification Search
CPC . G11C 11/4091; G11C 5/063; G11C 11/4085; G11C 11/4097
See application file for complete search history.

(56) References Cited

U.S. PATENT DOCUMENTS 11,751,383 B2 9/2023 Simsek-Ege
11,776,925 B2 10/2023 Simsek-Ege
(Continued)

OTHER PUBLICATIONS

He et al., "Microelectronic Devices Including Control Logic Circuitry Overlying Memory Arrays, and Related Memory Devices and Electronic Systems", filed Aug. 29, 2022, U.S. Appl. No. 17/898,150, 47 pages.

(Continued)

*Primary Examiner* — Min Huang

(74) *Attorney, Agent, or Firm* — TraskBritt

(57) ABSTRACT

A microelectronic device includes a memory array structure and a control circuitry structure vertically overlying and bonded to the memory array structure. The memory array structure includes array regions respectively including memory cells, digit lines, and word lines within horizontal areas thereof. The control circuitry structure includes control circuitry regions, sense amplifier (SA) sections including SA circuitry, and sub-word line driver (SWD) sections including SWD circuitry. The control circuitry regions horizontally overlap the array regions of the memory array structure. The SA sections respectively horizontally overlap each of two of the control circuitry regions horizontally neighboring one another in a first direction. The SWD sections are respectively interposed between two other of the control circuitry regions horizontally neighboring one another in a second direction orthogonal to the first direction. Additional microelectronic devices, memory devices, and electronic systems are also described.

20 Claims, 7 Drawing Sheets

(51) Int. Cl.
  *G11C 11/408* (2006.01)
  *G11C 11/4091* (2006.01)
  *G11C 11/4097* (2006.01)

(56) References Cited

U.S. PATENT DOCUMENTS

| | | | | | |
|---|---|---|---|---|---|
| 11,785,764 | B2 | 10/2023 | Simsek-Ege et al. | | |
| 11,837,594 | B2 | 12/2023 | Simsek-Ege et al. | | |
| 11,842,990 | B2 | 12/2023 | Parekh et al. | | |
| 2023/0005854 | A1 | 1/2023 | Simsek-Ege et al. | | |
| 2023/0005933 | A1 | 1/2023 | Simsek-Ege | | |
| 2023/0044232 | A1* | 2/2023 | Kai | ........................ | H10B 41/27 |
| 2023/0209803 | A1* | 6/2023 | Ito | ........................... | H10B 12/09 |
| | | | | | 257/296 |
| 2023/0301053 | A1 | 9/2023 | He et al. | | |
| 2024/0221823 | A1* | 7/2024 | Roy | ................. | G11C 11/40615 |

OTHER PUBLICATIONS

He et al., "Fin Field Effect Transistor Sense Amplifier Circuitry and Related Apparatuses and Computing Systems", filed Sep. 29, 2022, U.S. Appl. No. 17/936,760, 41 pages.
Simsek-Ege et al., "Microelectronic Devices and Memory Devices", filed Dec. 21, 2023, U.S. Appl. No. 18/393,416, 89 pages.
Simsek-Ege, "Methods of Forming Microelectronic Devices, and Related Microelectronic Devices and Electronic Systems", filed Sep. 7, 2022, U.S. Appl. No. 17/930,388, 77 pages.
Wieduwilt et al., "Global Column Repair With Local Column Decoder Circuitry, and Related Apparatuses, Methods, and Computing Systems", filed Oct. 4, 2022, U.S. Appl. No. 17/937,924, 24 pages.

\* cited by examiner

MICROELECTRONIC DEVICES, AND RELATED MEMORY DEVICES AND ELECTRONIC SYSTEMS

CROSS-REFERENCE TO RELATED APPLICATION

This application claims the benefit under 35 U.S.C. § 119(e) of U.S. Provisional Patent Application Ser. No. 63/486,778, filed Feb. 24, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including a control circuitry structure overlying a memory array structure, and to related memory devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

DETAILED DESCRIPTION

Figure 1:
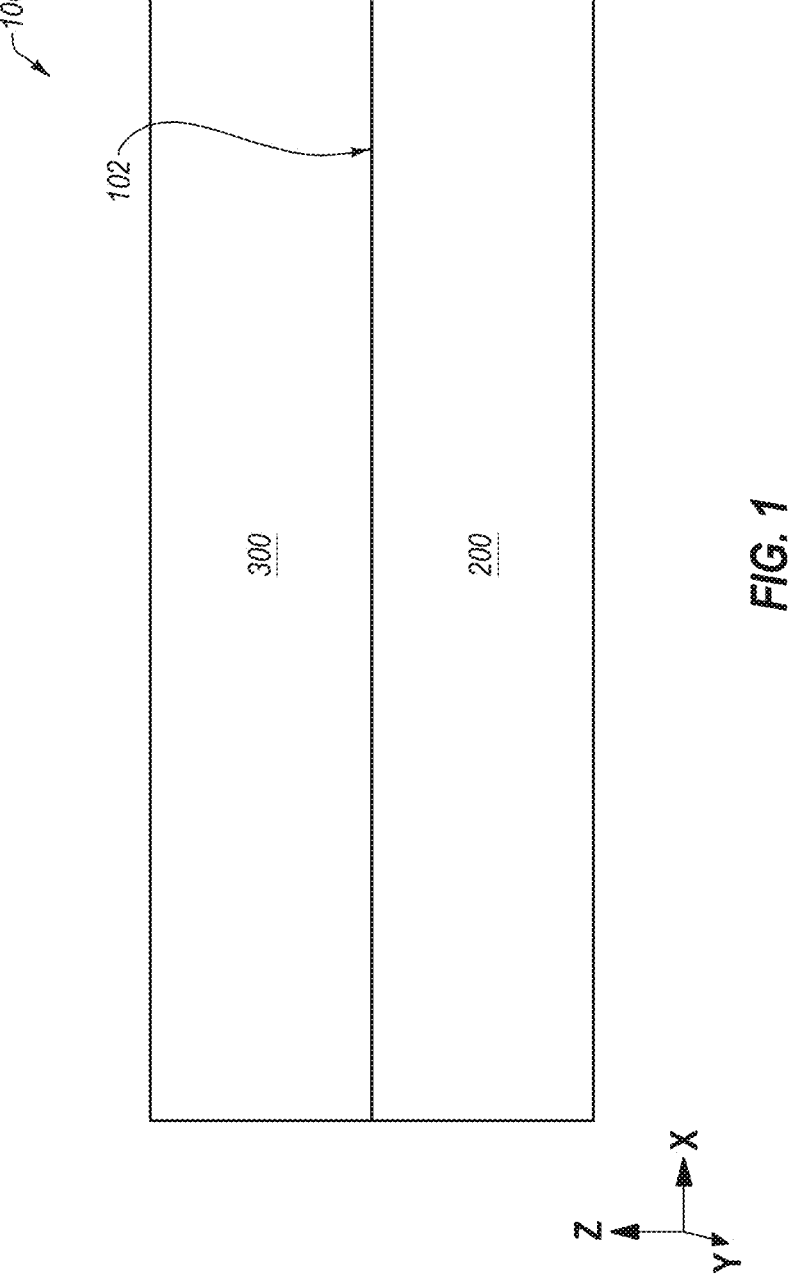
FIG. 1 is a simplified, partial longitudinal cross-sectional view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

FIG. 1 is a simplified, partial longitudinal cross-sectional view of a microelectronic device 100 (e.g., a memory device, such as a DRAM device), in accordance with some embodiments of the disclosure. The microelectronic device 100 may include a memory array structure 200 (e.g., a memory array wafer), and a control circuitry structure 300 (e.g., a control circuitry wafer) vertically overlying and attached to the memory array structure 200. The memory array structure 200 may include one or more array(s) of memory cells (e.g., volatile memory cells, such as DRAM cells). At least a majority (e.g., substantially all) of the memory cells of the microelectronic device 100 may be located within the memory array structure 200 (and, hence, outside of the control circuitry structure 300). The control circuitry structure 300 may include control logic devices formed of and including complementary metal-oxide-semi-conductor (CMOS) circuitry. At least a majority (e.g., sub-stantially all) of the CMOS circuitry (and, hence, the control logic devices) of the microelectronic device 100 may be located within the control circuitry structure 300 (and, hence, outside of the memory array structure 200). In addition, at least some of the CMOS circuitry may be positioned vertically above within horizontal areas of the array(s) of memory cells. Accordingly, the microelectronic device 100 may be considered to have a so-called "CMOS above array (CaA)" configuration.

In some embodiments, the control circuitry structure 300 is formed, at least in part, separate from the memory array structure 200; and then the control circuitry structure 300 is attached (e.g., bonded) to the memory array structure 200 at an interface 102 using oxide-oxide bonding or a combina-tion of oxide-oxide bonding and metal-metal bonding. For example, following the separate formations of the memory array structure 200 and the control circuitry structure 300, the control circuitry structure 300 and the memory array structure 200 may be brought into physical contact with one another at the interface 102, and then the resulting assembly may be exposed to a temperature greater than or equal to about 400° C. (e.g., within a range of from about 400° C. to about 800° C., greater than about 800° C.) to form oxide-to-oxide bonds between oxide dielectric material (e.g., $SiO_x$, such as $SiO_2$) of the memory array structure 200 and additional oxide dielectric material (e.g., additional $SiO_x$, such as additional $SiO_2$) of the control circuitry structure 300. In some embodiments, the oxide dielectric material of the memory array structure 200 and the additional oxide dielectric material of the control circuitry structure 300 are exposed to at least one temperature greater than about 800° C. to form oxide-to-oxide bonds between the oxide dielec-tric material of the memory array structure 200 and the additional oxide dielectric material of the control circuitry structure 300.

Figure 2:
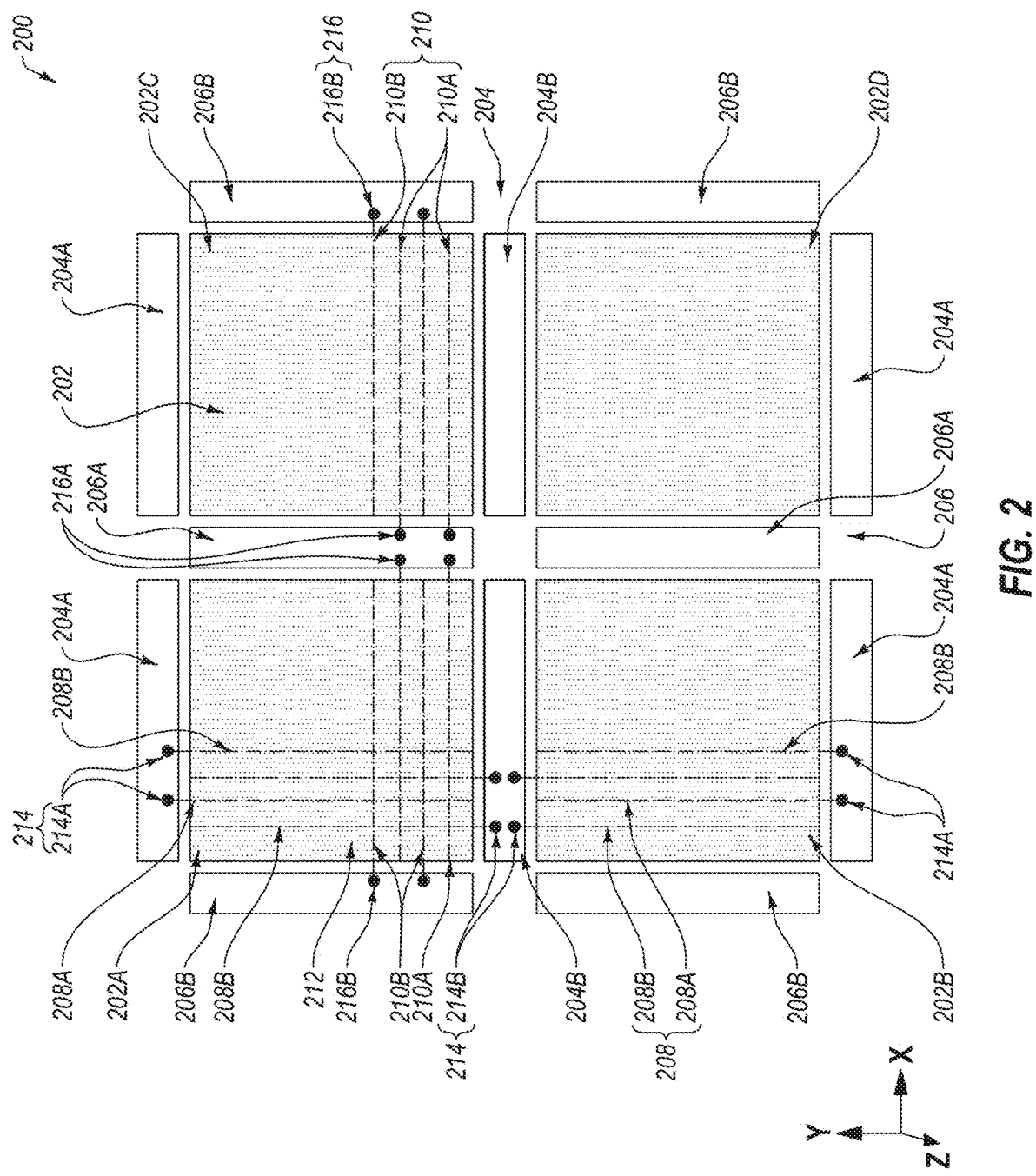
FIG. 2 is a simplified, schematic view of a memory array structure for the microelectronic device depicted in FIG. 1, in accordance with some embodiments of the disclosure.

FIG. 2 is a simplified, schematic view of a portion of the memory array structure 200 of the microelectronic device 100 (FIG. 1), in accordance with some embodiments of the disclosure. FIG. 2 shows an arrangement of various circuitry of the memory array structure 200.

As shown in FIG. 2, the memory array structure 200 may include array regions 202, digit line (DL) exit regions 204 (also referred to as "DL contact socket regions") interposed between pairs of the array regions 202 horizontally neigh-boring one another in the Y-direction, word line (WL) exit regions 206 (also referred to as "WL contact socket regions") interposed between additional pairs of the array regions 202 horizontally neighboring one another in the X-direction orthogonal to the Y-direction. The memory array structure 200 may also include one or more additional regions horizontally neighboring some of the array regions 202 in one or more of the first horizontal direction and the second horizontal direction. The array regions 202, the DL exit regions 204, and the WL exit regions 206 of the memory array structure 200 are each described in further detail below.

The array regions 202 of the memory array structure 200 may comprise regions of the memory array structure 200 having arrays of memory cells (e.g., arrays of DRAM cells) within horizontal area thereof. The memory array structure 200 may be formed to include a desired quantity of the array regions 202. For clarity and ease of understanding of the drawings and related description, FIG. 2 depicts the memory array structure 200 as including four (4) array regions 202: a first array region 202A, a second array region 202B, a third array region 202C, and a fourth array region 202D. As shown in FIG. 2, the second array region 202B may hori-zontally neighbor the first array region 202A in the Y-direc-tion, and may horizontally neighbor the fourth array region 202D in the X-direction; the third array region 202C may horizontally neighbor the first array region 202A in the X-direction, and may horizontally neighbor the fourth array region 202D in the Y-direction; and the fourth array region 202D may horizontally neighbor the third array region 202C in the Y-direction, and may horizontally neighbor the second array region 202B in the X-direction. However, the memory array structure 200 may include a different quantity of array regions 202. For example, the memory array structure 200 may be formed to include greater than four (4) array regions 202, such as greater than or equal to eight (8) array regions 202, greater than or equal to sixteen (16) array regions 202, greater than or equal to thirty-two (32) array regions 202, greater than or equal to sixty-four (64) array regions 202, greater than or equal to one hundred twenty eight (128) array regions 202, greater than or equal to two hundred fifty six (256) array regions 202, greater than or equal to five hundred twelve (512) array regions 202, or greater than or equal to one thousand twenty-four (1024) array regions 202.

In addition, the memory array structure 200 may include a desired distribution of the array regions 202. As shown in FIG. 2, in some embodiments, the memory array structure 200 includes rows of the array regions 202 extending in the X-direction, and columns of the array regions 202 extending in the Y-direction. The rows of the array regions 202 may, for example, include a first row including the first array region 202A and the third array region 202C, and a second row including the second array region 202B and the fourth array region 202D. The columns of the array regions 202 may, for example, include a first column including the first array region 202A and the second array region 202B, and a second column including the third array region 202C and the fourth array region 202D.

Each of the array regions 202 of the memory array structure 200 may include digit lines 208 (e.g., bit lines, data lines) extending the Y-direction, word lines 210 (e.g., access lines) extending in the X-direction, and memory cells 212 arranged at intersections of the digit lines 208 and the word lines 210. Rows of the memory cells 212 may be coupled to the word lines 210, and columns of the memory cells 212 may be coupled to the digit lines 208. The memory cells 212 within an individual array region 202 may, for example, comprise DRAM cells, resistive random access memory (RRAM) cells, conductive bridge random access memory (conductive bridge RAM) cells, magnetic random access memory (MRAM) cells, phase change material (PCM)

memory cells, phase change random access memory (PCRAM) cells, spin-torque-transfer random access memory (STTRAM) cells, oxygen vacancy-based memory cells, programmable conductor memory cells, or other types of memory cells. In some embodiments, the memory cells 212 within an individual array region 202 of the memory array structure 200 are DRAM cells.

The digit lines 208 may exhibit horizontally elongate shapes extending in parallel in the Y-direction. The digit lines 208 may include odd digit lines 208A, and even digit lines 208B horizontally alternating with the odd digit lines 208A in the X-direction. As described in further detail below, the odd digit lines 208A may be coupled to odd sense amplifier (SA) devices of the microelectronic device 100 (FIG. 1), and the even digit lines 208B may be coupled to even SA devices of the microelectronic device 100 (FIG. 1). The digit lines 208 (including the odd digit lines 208A and the even digit lines 208B) may individually be formed of and include conductive material. In some embodiments, the digit lines 208 are individually formed of and include one or more of W, Ru, Mo, and titanium nitride ($TiN_y$).

The word lines 210 may exhibit horizontally elongate shapes extending in parallel in the X-direction. The word lines 210 may include odd word lines 210A, and even word lines 210B horizontally alternating with the odd word lines 210A in the Y-direction. As described in further detail below, the odd word lines 210A may be coupled to odd sub-word line driver (SWD) devices of the microelectronic device 100 (FIG. 1), and the even word lines 210B may be coupled to even SWD devices of the microelectronic device 100 (FIG. 1). The word lines 210 (including the odd word lines 210A and the even word lines 210B) may individually be formed of and include conductive material. In some embodiments, the word lines 210 are individually formed of and include one or more of W, Ru, Mo, and $TiN_y$.

With continued reference to FIG. 2, the DL exit regions 204 of the memory array structure 200 may comprise horizontal areas of the memory array structure 200 configured and positioned to have at least some of the digit lines 208 horizontally terminate therein. For an individual DL exit region 204, at least some digit lines 208 operatively associated with the array regions 202 flanking (e.g., at opposing boundaries in the Y-direction) the DL exit region 204 may have ends within the horizontal area of the DL exit region 204. In addition, the DL exit regions 204 may also be configured and positioned to include digit line (DL) contact structures 214 with the horizontal bounds thereof that are operatively associated with at least some of the digit lines 208. The DL contact structures 214 may be formed of and include conductive material. The DL contact structures 214 may include odd DL contact structures 214A coupled to the odd digit lines 208A, and even DL contact structures 214B coupled to the even digit lines 208B. As described in further detail below, the DL contact structures 214 (e.g., odd DL contact structures 214A, even DL contact structures 214B) within the DL exit regions 204 may couple the digit lines 208 to control logic circuitry of control logic devices (e.g., SA devices, additional devices) within the control circuitry structure 300 (FIG. 1) of the microelectronic device 100 (FIG. 1). As shown in FIG. 2, in some embodiments, the DL exit regions 204 horizontally extend in the X-direction, and are horizontally interposed between horizontally neighboring rows of the array regions 202 in the Y-direction. The DL exit regions 204 may, for example, horizontally alternate with the rows of the array regions 202 in the Y-direction.

The DL exit regions 204 may include odd DL exit regions 204A and even DL exit regions 204B. The odd DL exit regions 204A may horizontally alternate with the even DL exit regions 204B in the Y-direction. An individual array region 202 may be horizontally interposed, in the Y-direction, between an individual odd DL exit region 204A and an individual even DL exit region 204B. The odd DL exit regions 204A may respectively include some of the odd digit lines 208A horizontally extending into and terminating within a horizontal area thereof; and the even DL exit regions 204B may respectively include some of the even digit lines 208B horizontally extending into and terminating within a horizontal area thereof. The odd DL exit regions 204A may respectively be free of any even digit lines 208B substantially horizontally extending into and terminating with the horizontal area thereof; and the even DL exit regions 204B may respectively be free of any odd digit lines 208A substantially horizontally extending into and terminating with the horizontal area thereof. As shown in FIG. 2, the odd DL contact structures 214A may be located within the horizontal areas of the odd DL exit regions 204A, and the even DL contact structures 214B may be located within the horizontal areas of the even DL exit regions 204B. The odd DL contact structures 214A may contact (e.g., physically contact, land on) portions of the odd digit lines 208A within the horizontal areas of the odd DL exit regions 204A. The even DL contact structures 214B may contact (e.g., physically contact, land on) portions of the even digit lines 208B within the horizontal areas of the even DL exit regions 204B.

Figure 3:
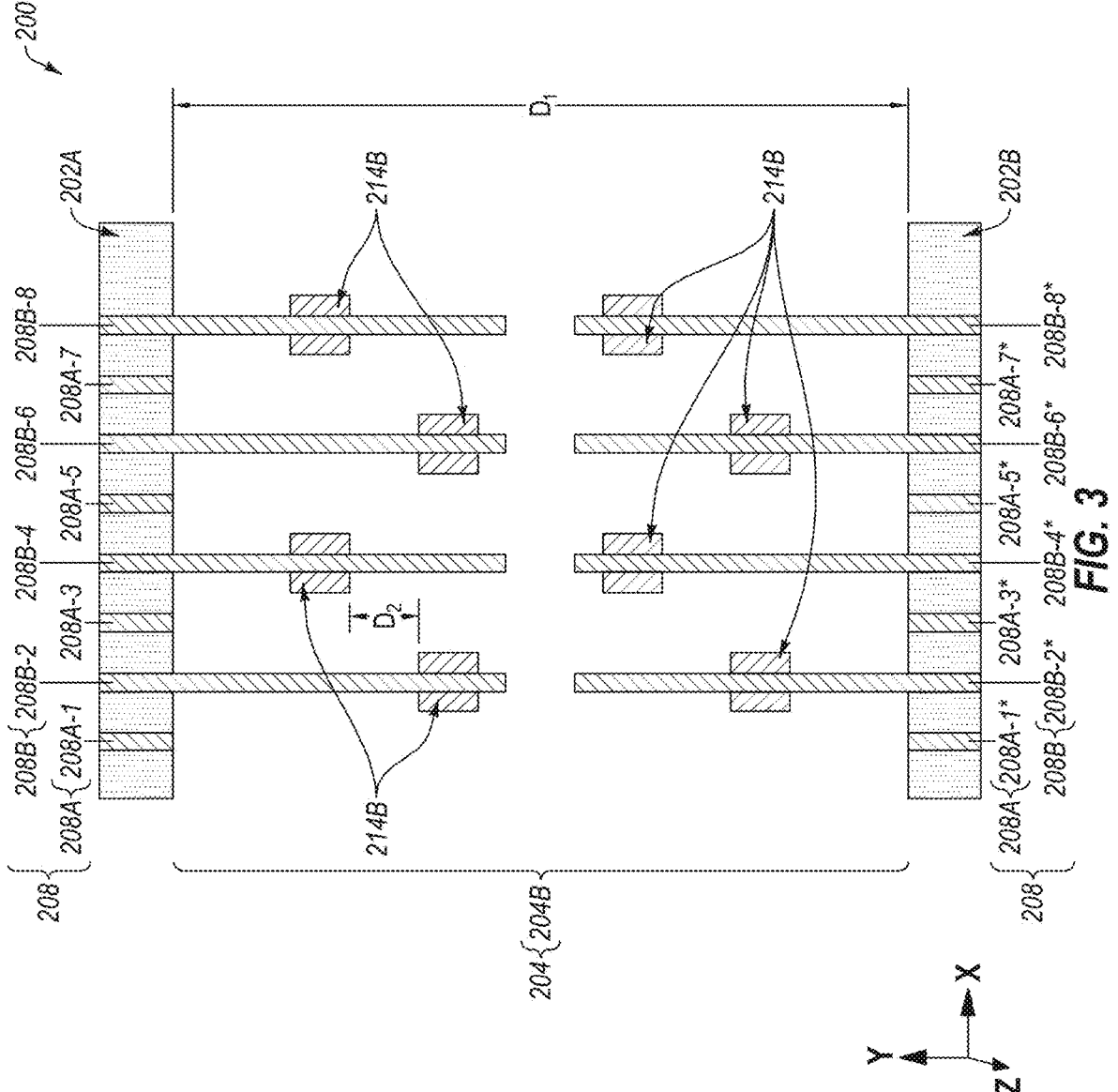
FIG. 3 is a simplified, expanded schematic view of a portion of the memory array structure depicted in FIG. 2, in accordance with some embodiments of the disclosure.

FIG. 3 is a simplified, expanded schematic view of a portion of the memory array structure 200 depicted in FIG. 2. FIG. 3 shows a configuration of digit lines 208 and DL contact structures 214 within a horizontal area of an individual DL exit region 204 of the memory array structure 200. The portion of the memory array structure 200 depicted in FIG. 3 encompasses parts of the first array region 202A, the second array region 202B, and the even DL exit region 204B horizontally interposed therebetween in the Y-direction. It will be understood that the configuration described hereinbelow with reference to FIG. 3, at least in relation to a general arrangement of the digit lines 208 and the DL contact structures 214, may be exhibited in other portions (e.g., other of the DL exit regions 204) of the memory array structure 200 as well.

Referring to FIG. 3, some of the digit lines 208 may be employed as so-called "base" digit lines (e.g., true digit lines), and some other of the digit lines 208 are separated from the some of the digit lines 208 in the Y-direction and may be employed as so-called "complementary" digit lines (e.g., digit bar lines). A group of the digit lines 208 employed as base digit lines may horizontally extend in the Y-direction through the first array region 202A; and an additional group of the digit lines 208 employed as complementary digit lines may horizontally extend in the Y-direction through the second array region 202B. In FIG. 3, asterisks (*) are used to distinguish complementary digit lines from base digit lines. The base digit lines include odd digit lines 208A, shown as base odd digit lines 208A-1, 208A-3, 208A-5, and 208A-7; and even digit lines 208B, shown as base even digit lines 208B-2, 208B-4, 208B-6, and 208B-8. The complementary digit lines include odd digit lines 208A*, shown as complementary odd digit lines 208A-1*, 208A-3*, 208A-5*, and 208A-7*; and even digit lines 208B*, shown as complementary digit lines 208B-2*, 208B-4*, 208B-6*, and 208B-8*. The base digit lines are substantially aligned with respective complementary digit lines in the X-direction. For example, the base odd digit lines 208A-1, 208A-3, 208A-5, and 208A-7 may be substantially aligned in the X-direction with the complementary odd digit lines 208A-1*, 208A-3*, 208A-5*, and 208A-7*, respectively; and the base even digit lines 208B-2, 208B-4, 208B-6, and 208B-8 may be substantially aligned in the X-direction with the complementary even digit lines 208B-2*, 208B-4*, 208B-6*, and 208B-8*.

The odd digit lines 208A (e.g., base odd digit lines 208A-1, 208A-3, 208A-5, and 208A-7) horizontally extending through the first array region 202A terminate at or within horizontal bounds (in the Y-direction) of the first array region 202A. The odd digit lines 208A do not substantially horizontally extend into the horizontal area of the even DL exit region 204B horizontally neighboring the first array region 202A. In some embodiments, horizontal ends (in the Y-direction) of the odd digit lines 208A most proximate to the even DL exit region 204B are substantially aligned with one another in the Y-direction, and are positioned at or outside of horizontal bounds (in the Y-direction) of the even DL exit region 204B. In addition, the odd digit lines 208A* (e.g., complementary odd digit lines 208A-1*, 208A-3*, 208A-5*, and 208A-7*) horizontally extending through the second array region 202B terminate at or within horizontal bounds (in the Y-direction) of the second array region 202B. The odd digit lines 208A* do not substantially horizontally extend into the horizontal area of the even DL exit region 204B horizontally neighboring the second array region 202B. In some embodiments, horizontal ends (in the Y-direction) of the odd digit lines 208A* most proximate to the even DL exit region 204B are substantially aligned with one another in the Y-direction, and are positioned at or outside of horizontally bounds (in the Y-direction) of the even DL exit region 204B.

The even digit lines 208B (e.g., base even digit lines 208B-2, 208B-4, 208B-6, and 208B-8) horizontally extending through the first array region 202A also horizontally extend into and partially through even DL exit region 204B horizontally neighboring the first array region 202A. The even digit lines 208B may horizontally extend, in the Y-direction, partially across a first distance $D_1$ between the first array region 202A and the second array region 202B defining a horizontal dimension, in the Y-direction, of the even DL exit region 204B. The even digit lines 208B terminate within the horizontal bounds (in the Y-direction) of the even DL exit region 204B. In some embodiments, horizontal ends (in the Y-direction) of the even digit lines 208B are substantially aligned with one another in the Y-direction within the even DL exit region 204B. In addition, the even digit lines 208B* (e.g., complementary even digit lines 208B-2*, 208B-4*, 208B-6*, and 208B-8*) horizontally extending through the second array region 202B also horizontally extend into and partially through even DL exit region 204B horizontally neighboring the second array region 202B. The even digit lines 208B* may horizontally extend, in the Y-direction, partially across the first distance $D_1$ between the first array region 202A and the second array region 202B defining the horizontal dimension, in the Y-direction, of the even DL exit region 204B. The even digit lines 208B* terminate within the horizontal bounds (in the Y-direction) of the even DL exit region 204B. In some embodiments, horizontal ends (in the Y-direction) of the even digit lines 208B* are substantially aligned with one another in the Y-direction within the even DL exit region 204B, and are offset in the Y-direction from the horizontal ends (in the Y-direction) of the even digit lines 208B within the even DL exit region 204B.

Still referring to FIG. 3, within the horizontal area of the even DL exit region 204B, some of the even DL contact structures 214B contact the even digit lines 208B (e.g., base even digit lines 208B-2, 208B-4, 208B-6, and 208B-8), and some other of the even DL contact structures 214B contact the even digit lines 208B* (e.g., complementary even digit lines 208B-2*, 208B-4*, 208B-6*, and 208B-8*). Each of the even digit lines 208B may have a respective one of the even DL contact structures 214B in contact (e.g., physical contact, electrical contact) therewith; and each even digit lines 208B* may have a respective additional one of the even DL contact structures 214B in contact (e.g., physical contact, electrical contact) therewith. An individual even DL contact structure 214B in contact with one of the even digit lines 208B (e.g., one of the base even digit lines 208B-2, 208B-4, 208B-6, and 208B-8) may be substantially horizontally aligned in the X-direction with another individual even DL contact structure 214B in contact with a one of the even digit lines 208B* (e.g., one of the complementary even digit lines 208B-2*, 208B-4*, 208B-6*, and 208B-8*) substantially horizontally aligned in the X-direction with the with the one of the even digit lines 208B. As a non-limiting example, an individual even DL contact structure 214B in contact with the base even digit line 208B-2 may be substantially horizontally aligned, in the X-direction, with another individual even DL contact structure 214B in contact with the complementary even digit line 208B-2*.

Within the horizontal area of the even DL exit region 204B, at least some of the even DL contact structures 214B in contact with different even digit lines 208B than one another may be horizontally offset from one another in the Y-direction; and at least some other of the even DL contact structures 214B in contact with different even digit lines 208B* than one another may be horizontally offset from one another in the Y-direction. In some embodiments, each even DL contact structure 214B is horizontally offset, in the X-direction and the Y-direction, from each other even DL contact structure 214B most horizontally proximate thereto. Some of the even DL contact structures 214B may be substantially aligned with one another in the Y-direction and offset from some other of the even DL contact structures 214B in the Y-direction. As non-limiting example, the even DL contact structures 214B in contact with the base even digit lines 208B-2 and 208B-6 may be substantially aligned with one another in the Y-direction; and the even DL contact structures 214B in contact with the base even digit lines 208B-4 and 208B-8 may be substantially aligned with one another in the Y-direction and may also be horizontally offset from the base even digit lines 208B-2 and 208B-6 in the Y-direction by a second distance $D_2$. As another non-limiting example, the even DL contact structures 214B in contact with the complementary even digit lines 208B-2* and 208B-6* may be substantially aligned with one another in the Y-direction; and the even DL contact structures 214B in contact with the complementary even digit lines 208B-4* and 208B-8* may be substantially aligned with one another in the Y-direction and may also be horizontally offset from the complementary even digit lines 208B-2* and 208B-6* in the Y-direction by the second distance $D_2$.

While FIG. 3 shows, in part, a configuration of even features (e.g., even digit lines 208B, even DL contact structures 214B) within an individual even DL exit region 204B of the memory array structure 200, an individual odd DL exit region 204A (FIG. 2) of the memory array structure 200 may exhibit a similar configuration to that shown in FIG. 3, as modified to account for odd features (e.g., odd digit lines 208A (FIG. 2), odd DL contact structures 214A (FIG. 2)) within the horizontal area thereof in place of the even features described with reference to FIG. 3. For example, for an individual odd DL exit region 204A (FIG. 2), odd digit lines 208A/208A* (e.g., base odd digit lines, complementary odd digit lines) may partially horizontally extend therethrough and terminate therein in a manner similar to that of the even digit lines 208B/208B* (e.g., base even digit lines, complementary even digit lines) shown in FIG. 3. In addition, odd DL contact structures 214A (FIG. 2) may be in contact with the odd digit lines 208A/208A* within the odd DL exit region 204A (FIG. 2), and may be arranged relative to one another in a manner similar to that of the even DL contact structures 214B shown in FIG. 3. Furthermore, substantially all even digit lines 208B/208B* horizontally extending through the array regions 202 (FIG. 2) horizontally neighboring (in the Y-direction) the odd DL exit region 204A (FIG. 2) may horizontally terminate at or outside of horizontal bounds (in the Y-direction) of the odd DL exit region 204A (FIG. 2).

With returned reference to FIG. 2, the WL exit regions 206 of the memory array structure 200 may comprise horizontal areas of the memory array structure 200 configured and positioned to have at least some of the word lines 210 horizontally terminate therein. For an individual WL exit region 206, at least some word lines 210 operatively associated with the array regions 202 flanking (e.g., at opposing boundaries in the X-direction) the WL exit region 206 may have ends within the horizontal area of the WL exit region 206. In addition, the WL exit regions 206 may also be configured and positioned to include word line (WL) contact structures 216 with the horizontal bounds thereof that are operatively associated with at least some of the word lines 210. The WL contact structures 216 may be formed of and include conductive material. The WL contact structures 216 may include odd WL contact structures 216A coupled to the odd word lines 210A, and even WL contact structures 216B coupled to the even word lines 210B. As described in further detail below, the WL contact structures 216 (e.g., odd WL contact structures 216A, even WL contact structures 216B) within the WL exit regions 206 may couple the word lines 210 to control logic circuitry of control logic devices (e.g., SWD devices, additional devices) within the control circuitry structure 300 (FIG. 1) of the microelectronic device 100 (FIG. 1). As shown in FIG. 2, in some embodiments, the WL exit regions 206 horizontally extend in the Y-direction, and are horizontally interposed between horizontally neighboring columns of the array regions 202 in the X-direction. The WL exit regions 206 may, for example, horizontally alternate with the columns of the array regions 202 in the X-direction.

The WL exit regions 206 may include odd WL exit regions 206A and even WL exit regions 206B. The odd WL exit regions 206A may horizontally alternate with the even WL exit regions 206B in the X-direction. An individual array region 202 may be horizontally interposed, in the X-direction, between an individual odd WL exit region 206A and an individual even WL exit region 206B. The odd WL exit regions 206A may respectively include some of the odd word lines 210A horizontally extending into and terminating within a horizontal area thereof; and the even WL exit regions 206B may respectively include some of the even word lines 210B horizontally extending into and terminating within a horizontal area thereof. The odd WL exit regions 206A may respectively be free of any even word lines 210B substantially horizontally extending into and terminating with the horizontal area thereof; and the even WL exit regions 206B may respectively be free of any odd word lines 210A substantially horizontally extending into and terminating with the horizontal area thereof. As shown in FIG. 2, the odd WL contact structures 216A may be located within the horizontal areas of the odd WL exit regions 206A, and the even WL contact structures 216B may be located within the horizontal areas of the even WL exit regions 206B. The odd WL contact structures 216A may contact (e.g., physically contact, land on) portions of the odd word lines 210A within the horizontal areas of the odd WL exit regions 206A. The even WL contact structures 216B may contact (e.g., physically contact, land on) portions of the even word lines 210B within the horizontal areas of the even WL exit regions 206B.

With continued reference to FIG. 2, one or more additional regions (e.g., one or more additional socket regions) of the memory array structure 200 may comprise horizontal areas of the memory array structure 200 including conductive contact structures and conductive routing structures configured and positioned to facilitate electrical connections between one or more other features of the memory array structure 200 and back end of line (BEOL) structures of the microelectronic device 100 (FIG. 1). The BEOL structures may, for example, be positioned within or above the control circuitry structure 300 (FIG. 1) of the microelectronic device 100 (FIG. 1). Optionally, the additional regions may also include one or more of stacked cross point array capacitors (SCCAPs) and capacitor structures configured to be coupled to and employed to assist with powering additional devices (e.g., control logic devices, access devices) of the microelectronic device 100 (FIG. 1). The additional regions may horizontally neighbor one or more peripheral horizontal boundaries (e.g., in the Y-direction, in the X-direction) of one or more groups of the array regions 202. As a non-limiting example, the additional regions may horizontally neighbor a shared horizontal boundary of the second array region 202B and the fourth array region 202D. As another non-limiting example, the additional regions may horizontally neighbor a shared horizontal boundary of a different group of the array regions 202 (e.g., a shared horizontal boundary of the third array region 202C and the fourth array region 202D, a shared horizontal boundary of the first array region 202A and the third array region 202C, a shared horizontal boundary of the first array region 202A and the second array region 202B). As a further non-limiting example, the memory array structure 200 may be formed to include multiple (e.g., a plurality of, more than one) additional regions horizontally neighboring different groups of the array regions 202 than one another. In some embodiments, multiple additional regions collectively substantially horizontally surround (e.g., substantially horizontally circumscribe) the array regions 202.

Figure 4:
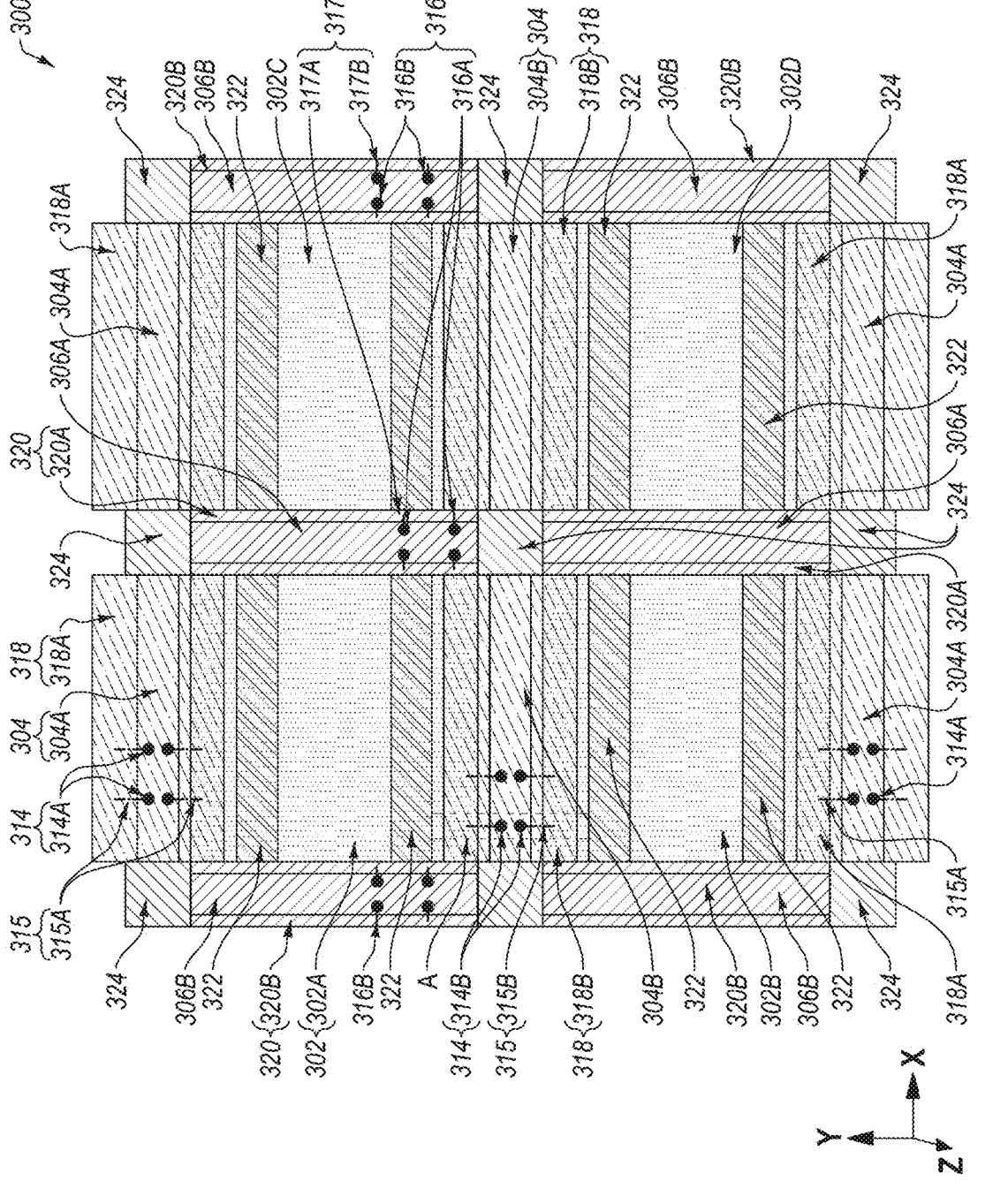
FIG. 4 is a simplified, schematic view of a control circuitry structure for the microelectronic device depicted in FIG. 1, in accordance with some embodiments of the disclosure.

FIG. 4 is a simplified, schematic view of a portion of the control circuitry structure 300 of the microelectronic device 100 (FIG. 1), in accordance with some embodiments of the disclosure. The control circuitry structure 300 may include control circuitry regions 302; DL contact regions 304 horizontally alternating with the control circuitry regions 302 in the Y-direction; WL contact regions 306 horizontally alternating with the control circuitry regions 302 in the Y-direction; and mini-gap (MG) regions 324 horizontally interposed in the Y-direction between horizontally neighboring WL contact regions 306, and horizontally interposed in the X-direction between horizontally neighboring DL contact regions 304. The control circuitry structure 300 may also include SA sections 318 overlapping horizontal areas of the control circuitry regions 302 and the DL contact regions 304; SWD sections 320 overlapping horizontal areas of the WL contact regions 306; and column decoder sections 322 overlapping horizontal areas of the control circuitry regions 302. The control circuitry regions 302, the DL contact regions 304, the word line contact regions 306, the SA sections 318, the SWD sections 320, the column decoder sections 322, the MG regions 324, and additional features (e.g., additional regions, additional sections, additional structures, additional devices) of the control circuitry structure 300 are described in further detail below.

The control circuitry regions 302 of the control circuitry structure 300 may comprise regions of the control circuitry structure 300 having control logic circuitry of the microelectronic device 100 (FIG. 1) within horizontal areas thereof. The control logic circuitry of the control circuitry regions 302 of the control circuitry structure 300 may be operatively associated with circuitry (e.g., memory cells) of the memory array structure 200 (FIG. 2) of the microelectronic device 100 (FIG. 1), as described in further detail below. The control circuitry structure 300 may be formed to include a desired quantity of the control circuitry regions 302. In some embodiments, a quantity of the control circuitry regions 302 of the control circuitry structure 300 substantially equals a quantity of the array regions 202 (FIG. 2) of the memory array structure 200 (FIG. 2) vertically thereunder. Each control circuitry region 302 may at least partially (e.g., substantially) horizontally overlap a respective array region 202 (FIG. 2) of the memory array structure 200 (FIG. 2). In some embodiments, a horizontal center (e.g., in the X-direction and the Y-direction) of each control circuitry region 302 of the control circuitry structure 300 is substantially horizontally aligned with a horizontal center (e.g., in the X-direction and the Y-direction) of a respective array region 202 (FIG. 2) of the memory array structure 200 (FIG. 2). A horizontal area of an individual control circuitry region 302 may be greater than or equal to a horizontal area of an individual array region 202 (FIG. 2) that the control circuitry region 302 horizontally overlaps.

For clarity and ease of understanding of the drawings and related description, FIG. 4 depicts the control circuitry regions 302 as including four (4) control circuitry regions 302: a first control circuitry region 302A, a second control circuitry region 302B, a third control circuitry region 302C, and a fourth control circuitry region 302D. As shown in FIG. 4, the second control circuitry region 302B may horizontally neighbor the first control circuitry region 302A in the Y-direction, and may horizontally neighbor the fourth control circuitry region 302D in the X-direction; the third control circuitry region 302C may horizontally neighbor the first control circuitry region 302A in the X-direction, and may horizontally neighbor the fourth control circuitry region 302D in the Y-direction; and the fourth control circuitry region 302D may horizontally neighbor the third control circuitry region 302C in the Y-direction, and may horizontally neighbor the second control circuitry region 302B in the X-direction. The first control circuitry region 302A may at least partially (e.g., substantially) horizontally overlap the first array region 202A (FIG. 2) of the memory array structure 200 (FIG. 2); the second control circuitry region 302B may at least partially (e.g., substantially) horizontally overlap the second array region 202B of the memory array structure 200 (FIG. 2); the third control circuitry region 302C may at least partially (e.g., substantially) horizontally overlap the third array region 202C (FIG. 2) of the memory array structure 200 (FIG. 2); and the fourth control circuitry region 302D may at least partially (e.g., substantially) horizontally overlap the fourth array region 202D (FIG. 2) of the memory array structure 200 (FIG. 2). However, the control circuitry structure 300 may include a different quantity of control circuitry regions 302. For example, the control circuitry structure 300 may be formed to include greater than four (4) control circuitry regions 302, such as greater than or equal to eight (8) control circuitry regions 302, greater than or equal to sixteen (16) control circuitry regions 302, greater than or equal to thirty-two (32) control circuitry regions 302, greater than or equal to sixty-four (64) control circuitry regions 302, greater than or equal to one hundred twenty eight (128) control circuitry regions 302, greater than or equal to two hundred fifty six (256) control circuitry regions 302, greater than or equal to five hundred twelve (512) control circuitry regions 302, or greater than or equal to one thousand twenty-four (1024) control circuitry regions 302.

The DL contact regions 304 of the control circuitry structure 300 vertically overlie, at least partially (e.g., substantially) horizontally overlap, and are operatively associated with the DL exit regions 204 (FIG. 2) of the memory array structure 200 (FIG. 2). As described in further detail below, the DL contact regions 304 may comprise so-called "read/write" (RW) gap regions within SA circuitry of the SA sections 318. In some embodiments, a horizontal center, in the Y-direction, of an individual DL contact region 304 of the control circuitry structure 300 is substantially aligned with a horizontal center, in the Y-direction, of an individual DL exit region 204 (FIG. 2) of the memory array structure 200 (FIG. 2) thereunder. A horizontal area of an individual DL contact region 304 may be less than a horizontal area of an individual DL exit region 204 (FIG. 2) horizontally overlapped by the DL contact region 304. The DL contact regions 304 of the control circuitry structure 300 may substantially linearly extend in the X-direction; and may be horizontally interposed, in the Y-direction, between control circuitry regions 302 horizontally neighboring one another in the Y-direction.

As shown in FIG. 4, the DL contact regions 304 may include additional DL contact structures 314 and routing structures 315 within horizontal areas thereof. The additional DL contact structures 314 and the routing structures 315 may individually be formed of and include conductive material. The additional DL contact structures 314 and the routing structures 315 may be coupled to the DL contact structures 214 (FIGS. 2 and 3) (and, hence, the digit lines 208 (FIGS. 2 and 3)) within horizontal areas of the DL exit regions 204 (FIG. 2) of the memory array structure 200 (FIG. 2). In some embodiments, the additional DL contact structures 314 directly physically contact the DL contact structures 214 (FIGS. 2 and 3). The additional DL contact structures 314 may include odd additional DL contact structures 314A coupled to odd DL contact structures 214A (and odd digit lines 208A) (FIG. 2), and even additional DL contact structures 314B coupled to even DL contact structures 214B (and even digit lines 208B) (FIGS. 2 and 3). The routing structures 315 may include odd routing structures 315A coupled to the odd additional DL contact structures 314A, and even routing structures 315B coupled to the even additional DL contact structures 314B. The additional DL contact structures 314 and the routing structures 315 may also be coupled to SA circuitry within the SA sections 318, as described in further detail below.

The DL contact regions 304 may include odd DL contact regions 304A and even DL contact regions 304B. The odd DL contact regions 304A may horizontally alternate with the even DL contact regions 304B in the Y-direction. An individual control circuitry region 302 may be horizontally interposed, in the Y-direction, between an individual odd DL contact region 304A and an individual even DL contact region 304B. The odd DL contact regions 304A may include the odd additional DL contact structures 314A and the odd routing structures 315A within horizontal areas thereof. The even DL contact regions 304B may include the even additional DL contact structures 314B and the even routing structures 315B within horizontal areas thereof.

The WL contact regions 306 of the control circuitry structure 300 vertically overlie, at least partially (e.g., substantially) horizontally overlap, and are operatively associated with the WL exit regions 206 (FIG. 2) of the memory array structure 200 (FIG. 2). In some embodiments, a horizontal center, in the X-direction, of an individual word line contact section 306 of the control circuitry structure 300 is substantially aligned with a horizontal center, in the X-direction, of an individual WL exit region 206 (FIG. 2) of the memory array structure 200 (FIG. 2) thereunder. A horizontal area of an individual WL contact region 306 may be less than or equal to a horizontal area of an individual WL exit region 206 (FIG. 2) that the WL contact region 306 horizontally overlaps. The WL contact regions 306 of the control circuitry structure 300 may substantially linearly extend in the Y-direction; and may be horizontally interposed, in the X-direction, between control circuitry regions 302 horizontally neighboring one another in the X-direction.

As shown in FIG. 4, the WL contact regions 306 may include additional WL contact structures 316 and additional routing structures 317 within horizontal areas thereof. The additional WL contact structures 316 and the additional routing structures 317 may individually be formed of and include conductive material. The additional WL contact structures 316 and the additional routing structures 317 may be coupled to the WL contact structures 216 (FIGS. 2 and 3) (and, hence, the word lines 210 (FIG. 2)) within horizontal areas of the WL exit regions 206 (FIG. 2) of the memory array structure 200 (FIG. 2). In some embodiments, the additional WL contact structures 316 directly physically contact the WL contact structures 216 (FIG. 2). The additional WL contact structures 316 may include odd additional WL contact structures 316A coupled to odd WL contact structures 216A (and odd word lines 210A) (FIG. 2), and even additional WL contact structures 316B coupled to even WL contact structures 216B (and even word lines 210B) (FIG. 2). The additional routing structures 317 may include odd additional routing structures 317A coupled to the odd additional WL contact structures 316A, and even additional routing structures 317B coupled to the even additional WL contact structures 316B. The additional WL contact structures 316 and the routing structures 315 may also be coupled to SWD circuitry within the SWD sections 320, as described in further detail below.

The WL contact regions 306 may include odd WL contact regions 306A and even WL contact regions 306B. The odd WL contact regions 306A may horizontally alternate with the even WL contact regions 306B in the X-direction. An individual control circuitry region 302 may be horizontally interposed, in the X-direction, between an individual odd WL contact region 306A and an individual even WL contact region 306B. The odd WL contact regions 306A may include the odd additional WL contact structures 316A and the odd additional routing structures 317A within horizontal areas thereof. The even WL contact regions 306B may include the even additional WL contact structures 316B and the even additional routing structures 317B within horizontal areas thereof.

Still referring to FIG. 4, the SA sections 318 of the control circuitry structure 300 may include SA circuitry and SA devices of the microelectronic device 100 (FIG. 1) within horizontal areas thereof. For an individual pair of the control circuitry regions 302 horizontally neighboring one another in the Y-direction and substantially horizontally aligned with one another in the X-direction (e.g., the first control circuitry region 302A and the second control circuitry region 302B, the third control circuitry region 302C and the fourth control circuitry region 302D), an individual SA section 318 may horizontally overlap and at least partially define neighboring portions (e.g., neighboring end portions in the Y-direction) of the pair of the control circuitry regions 302. The SA section 318 may also horizontally overlap and at least partially define the DL contact region 304 horizontally interposed, in the Y-direction, between the pair of the control circuitry regions 302. Each of the SA sections 318 operatively associated with the pair of the control circuitry regions 302 may be substantially horizontally aligned, in the X-direction, with one another.

Furthermore, for an additional individual pair of the control circuitry regions 302 horizontally neighboring one another in the X-direction and substantially horizontally aligned with one another in the Y-direction (e.g., the first control circuitry region 302A and the third control circuitry region 302C, the second control circuitry region 302B and the fourth control circuitry region 302D), two (2) of the SA sections 318 operatively associated with the additional pair of the control circuitry regions 302 may be substantially aligned with one another in the Y-direction; and two (2) other of the SA sections 318 operatively associated with the additional pair of the control circuitry regions 302 may be substantially aligned with one another in the Y-direction and may be horizontally offset from the two (2) of the SA sections 318 in the Y-direction. A horizontal distance in the X-direction between the two (2) of the SA sections 318 may be substantially equal to a horizontal distance in the X-direction between the two (2) other of the SA sections 318.

The SA sections 318 may include odd SA sections 318A and even SA sections 318B. The odd SA sections 318A may horizontally alternate with the even SA sections 318B in the Y-direction. The odd SA sections 318A may include odd SA devices (but not even SA devices) within horizontal areas thereof, and the even SA sections 318B may include even SA devices (but not odd SA devices) within horizontal areas thereof. The odd SA devices of the odd SA sections 318A may be coupled to the odd digit lines 208A (FIG. 2) of the memory array structure 200 (FIG. 2) by way of the odd routing structures 315A, the odd additional DL contact structures 314A, and the odd DL contact structures 214A (FIG. 2). The even SA devices of the even SA sections 318B may be coupled to the even digit lines 208B (FIGS. 2 and 3) of the memory array structure 200 (FIG. 2) by way of the even routing structures 315B, the even additional DL contact structures 314B, and the even DL contact structures 214B (FIGS. 2 and 3). The odd SA sections 318A may horizontally overlap and partially define the odd DL contact regions 304A, and the even SA sections 318B may horizontally overlap and partially define the even DL contact regions 304B.

An individual control circuitry region 302 may include portions of one (1) odd SA section 318A and one (1) even SA section 318B within the horizontal area thereof. The odd SA section 318A may be positioned at one end (e.g., horizontal boundary) of the control circuitry region 302 in the Y-direction; and the even SA section 318B may be positioned at another, opposing end (e.g., opposing horizontal boundary) of the control circuitry region 302 in the Y-direction. The odd SA section 318A and the even SA section 318B may each horizontally extend, in X-direction, substantially completely across a maximum horizontal dimension of the control circuitry region 302 in the X-direction. The odd SA section 318A may horizontally overlap and partially define each of the control circuitry region 302 and an another control circuitry region 302 neighboring the control circuitry region 302 in the Y-direction; and the even SA section 318B may horizontally overlap and partially define each of the control circuitry region 302 and an additional control circuitry region 302 neighboring the control circuitry region 302 in the Y-direction.

Figure 5:
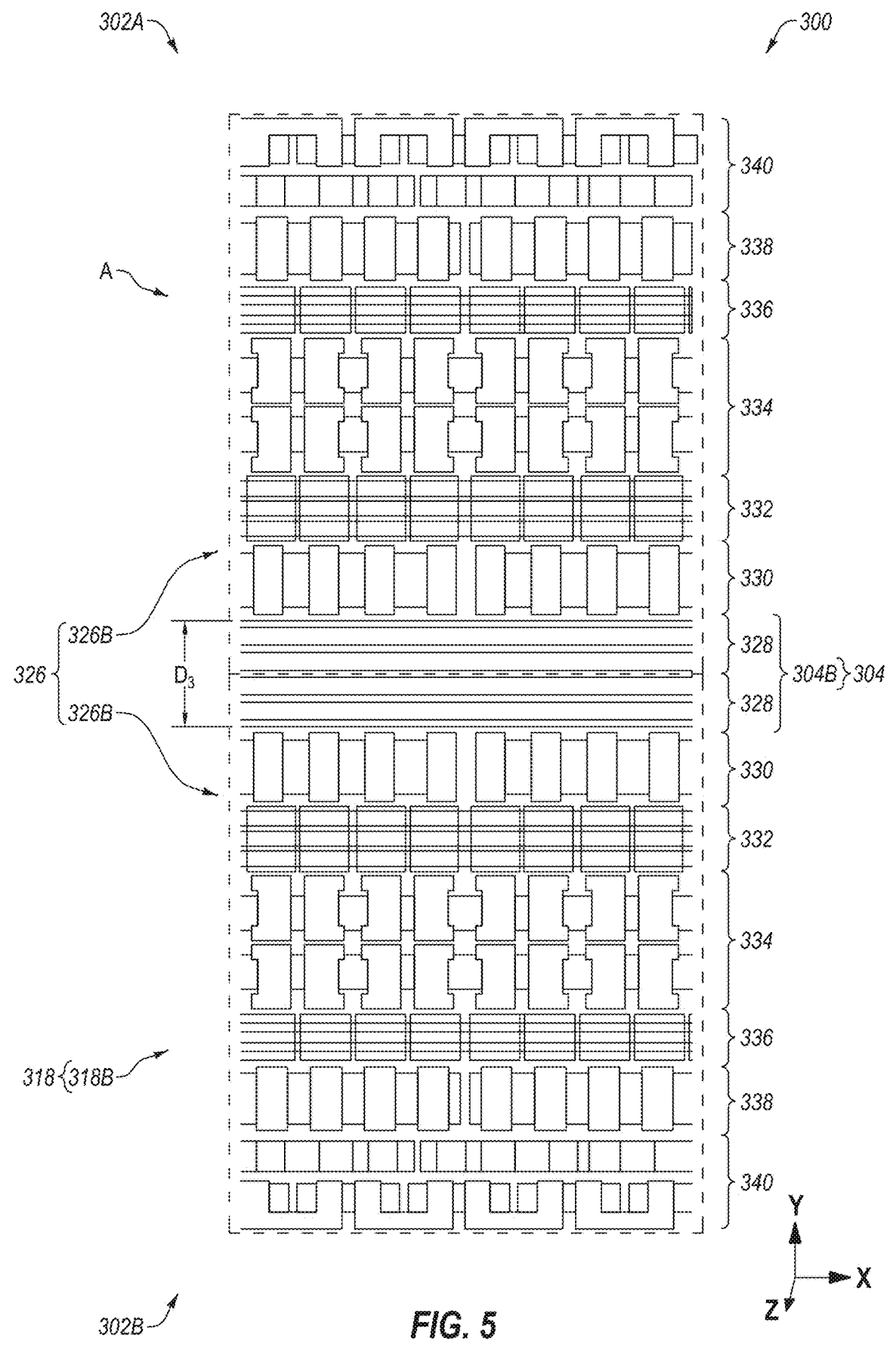
FIG. 5 is a simplified, expanded schematic view of a portion of the control circuitry structure depicted in FIG. 4, in accordance with some embodiments of the disclosure.

FIG. 5 is a simplified, expanded schematic view of a portion A (illustrated with a dashed box in FIG. 4) of the control circuitry structure 300 depicted in FIG. 4, in accordance with some embodiments of the disclosure. FIG. 5 shows a configuration of SA devices 326 within a horizontal area of an individual SA section 318 of the control circuitry structure 300. The portion A of the control circuitry structure 300 depicted in FIG. 3 encompasses parts of the first control circuitry region 302A, the second control circuitry region 302B, and the even DL contact region 304B horizontally interposed therebetween in the Y-direction. It will be understood that the configuration described hereinbelow with reference to FIG. 3, at least in relation to configurations of the SA devices 326 and effect thereof on a configuration of the DL contact region 304, may be exhibited in other portions (e.g., other SA sections 318) of the control circuitry structure 300 as well.

Referring to FIG. 5, an individual SA section 318 includes some (e.g., a group of) SA devices 326 horizontally overlapping and partially defining one of the control circuitry regions 302 (e.g., the first control circuitry region 302A) of the control circuitry structure 300; and some other (e.g., an additional group of) SA devices 326 offset from the some SA devices 326 in the Y-direction, substantially aligned with the some SA devices 326 in the X-direction, and horizontally overlapping and partially defining another of the control circuitry regions 302 (e.g., the second control circuitry region 302B) of the control circuitry structure 300. For example, as shown in FIG. 5, an individual even SA section 318B may include two (2) even SA devices 326B offset from one another in the Y-direction and substantially aligned with one another in the X-direction. A first of the two (2) even SA devices 326B may horizontally overlap and partially define the first control circuitry region 302A of the control circuitry structure 300, and a second of the two (2) even SA devices 326B may horizontally overlap and partially define the second control circuitry region 302B of the control circuitry structure 300. Portions of the two (2) even SA devices 326B may also horizontally overlap and partially define the even DL contact region 304B interposed between the first control circuitry region 302A and the second control circuitry region 302B of the control circuitry structure 300.

An individual SA device 326 (e.g., an even SA device 326B) of an individual SA section 318 (e.g., an even SA section 318B) may, for example, comprise a voltage transfer characteristic (VTC) SA device. The SA device 326 may include a RW gap area 328, N-type sense amplifier (NSA) area 330 including NSA circuitry, VTC area 332 including VTC circuitry, a P-type sense amplifier (PSA) area 334 including PSA circuitry, an additional VTC area 336 including additional VTC circuitry, additional NSA area 338 including additional NSA circuitry, and column select (CS) area 340 including CS circuitry. In the Y-direction, the NSA area 330 may neighbor the RW gap area 328, the VTC area 332 may neighbor the NSA area 330, the PSA area 334 may neighbor the VTC area 332, the additional VTC area 336 may neighbor the PSA area 334, the additional NSA area 338 may neighbor the additional VTC area 336, and the CS area 340 may neighbor the additional NSA area 338. In the Y-direction, the NSA area 330 may be interposed between the RW gap area 328 and the VTC area 332, the VTC area

332 may be interposed between the NSA area 330 and the PSA area 334, the PSA area 334 may be interposed between the VTC area 332 and the additional VTC area 336, the additional VTC area 336 may be interposed between the PSA area 334 and the additional NSA area 338, and the additional NSA area 338 may be interposed between the additional VTC area 336 and the CS area 340.

For two (2) SA devices 326 (e.g., two (2) even SA devices 326B) offset from one another in the Y-direction and substantially aligned with one another in the X-direction, the two (2) SA devices 326 may be oriented relative to one another such that a sequence (e.g., order) of the areas (e.g., the RW gap area 328, the NSA area 330, the VTC area 332, the PSA area 334, the additional VTC area 336, the additional NSA area 338, the CS area 340) of a first of the two (2) SA devices 326 mirrors a sequence of the areas (e.g., the RW gap area 328, the NSA area 330, the VTC area 332, the PSA area 334, the additional VTC area 336, the additional NSA area 338, the CS area 340) of a second of the two (2) SA devices 326. The RW gap area 328 of the first of the two (2) SA devices 326 may be positioned directly horizontally adjacent to the RW gap area 328 of the second of the two (2) SA devices 326; and sequences (e.g., orders) of the other areas (e.g., NSA area 330, the VTC area 332, the PSA area 334, the additional VTC area 336, the additional NSA area 338, the CS area 340) of the two (2) SA devices 326 may correspond to one another in paths horizontally extending away from the adjacent RW gap areas 328. The adjacent RW gap areas 328 of the two (2) SA devices 326 may partially define the DL contact region 304 (e.g., even DL contact region 304B) operatively associated with the SA section 318 (e.g., even SA section 318B). For example, the DL contact region 304 may have an overall horizontal dimension $D_3$ in the Y-direction defined by combined horizontal dimensions in the Y-direction of the adjacent RW gap areas 328 of the two (2) SA devices 326.

In additional embodiments, the two (2) SA devices 326 (e.g., two (2) even SA devices 326B) are oriented differently relative to one another than depicted in FIG. 5. As a non-limiting example, the RW gap area 328 of a first of the two (2) SA devices 326 may be spaced apart from the RW gap area 328 of a second of the two (2) SA devices 326, such that one or more other areas (e.g., the NSA area 330, the VTC area 332, the PSA area 334, the additional VTC area 336, the additional NSA area 338, the CS area 340) of at least one of the two (2) SA devices 326 is horizontally interposed between the RW gap areas 328 of the two (2) SA devices 326. An orientation of at least one of the two (2) SA devices 326 may be horizontally rotated by 180 degrees relative to the orientation depicted in FIG. 5. For example, only one of the two (2) SA devices 326 may be horizontally rotated by 180 degrees relative to the orientation depicted in FIG. 5, such that the CS area 340 thereof is positioned relatively more proximate to the RW gap area 328 of the other of the two (2) SA devices 326 than is the RW gap area 328 thereof. As another example, each of the two (2) SA devices 326 may be horizontally rotated by 180 degrees relative to the orientation depicted in FIG. 5, such that the CS areas 340 of the two (2) SA devices 326 are positioned relatively more proximate to one another than the RW gap areas 328 of the two (2) SA devices 326. In such embodiments, the DL contact region 304 (e.g., even DL contact region 304B) shown in FIG. 5 is instead divided into two (2) DL contact regions 304 (e.g., two (2) even DL contact regions 304B) discrete from one another in the Y-direction. At least one (e.g., only one or both) of the two (2) DL contact regions 304 may be horizontally offset in the Y-direction from the DL exit region 204 (e.g., even DL exit region 204B) (FIG. 2) of the memory array structure 200 (FIG. 2) most horizontally proximate thereto in the Y-direction. To account for the horizontal offset of the at least one of the two (2) discrete DL contact regions 304 relative to the DL exit region 204 (FIG. 2), further routing structures may be vertically interposed between and coupled to the additional DL contact structures 314 (e.g., even additional DL contact structures 314B) (FIG. 4) within the at least one of the two (2) discrete DL contact regions 304 and the DL contact structures 214 (e.g., even DL contact structures 214B) (FIG. 2) within the DL exit region 204 (FIG. 2). The further routing structures may horizontally extend, in the Y-direction, between the additional DL contact structures 314 and the DL contact structures 214 (FIG. 2).

Figure 6:
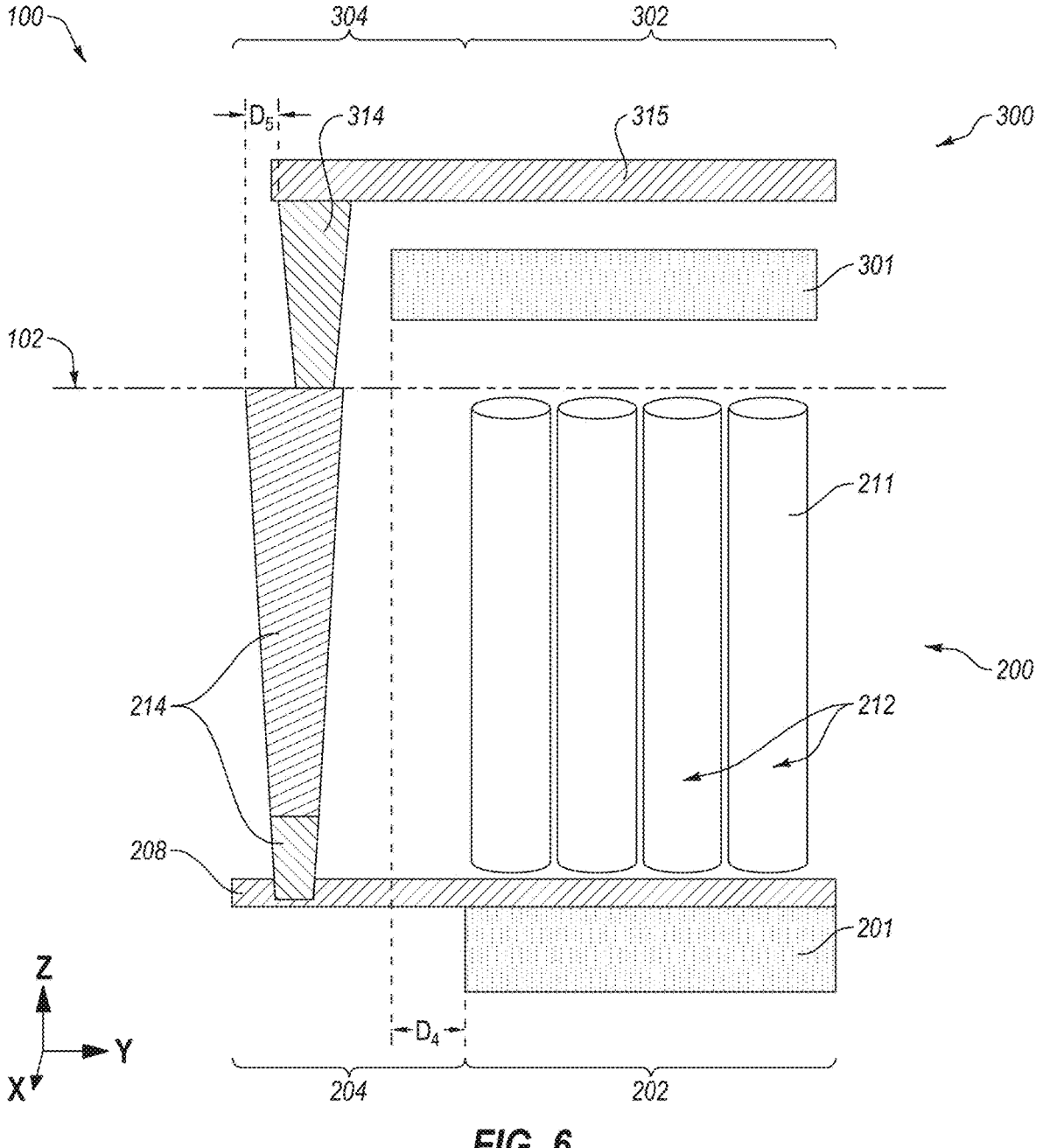
FIG. 6 is a simplified, partial longitudinal cross-sectional view of the microelectronic device depicted in FIG. 1, including features of the memory array structure depicted in FIG. 2 and the control circuitry structure depicted in FIG. 4, in accordance with some embodiments of the disclosure.

FIG. 6 is a simplified, partial longitudinal cross-sectional view of the microelectronic device 100, including features of the memory array structure 200 and the control circuitry structure 300, in accordance with some embodiments of the disclosure. The portion of the microelectronic device 100 depicted in FIG. 6 encompasses parts of an individual array region 202 and a neighboring individual DL exit region 204 of the memory array structure 200, as well as parts of an individual control circuitry region 302 and a neighboring individual DL contact region 304 of the control circuitry structure 300 attached to the memory array structure 200 at the interface 102. For clarity and ease of understanding the drawings and related description, some features (e.g., regions, section, structures, circuitry, devices) previously described with reference to one or more of FIGS. 2 through 5 are not depicted in FIG. 6, and some features described hereinbelow with reference to FIG. 6 are not depicted in one or more of FIGS. 2 through 5. However, unless described otherwise below, it will be understood that any features described with reference to at least one of FIGS. 1 through 6 may be included in the microelectronic device 100.

Referring to FIG. 6, for an individual control circuitry region 302 of the control circuitry structure 300 horizontally overlapping an individual array region 202 of the memory array structure 200, the control circuitry region 302 may be substantially confined with or may horizontally extend beyond a horizontal area of the array region 202. In some embodiments, a horizontal area of the control circuitry region 302 is substantially confined with a horizontal area of the array region 202. For example, a base structure 301 (e.g., base semiconductor structure) of the control circuitry structure 300 that includes circuitry of the control circuitry region 302 may terminate, in the Y-direction, at or inward of a horizontal boundary of an additional base structure 201 (e.g., an additional base semiconductor structure) of the memory array structure 200 that includes additional circuitry of the array region 202. Within the control circuitry region 302, the base structure 301 of the control circuitry structure 300 may include control logic circuitry, such as SA devices 326 (FIG. 5) coupled to the routing structures 315. Within the array region 202, the additional base structure 201 of the memory array structure 200 may include memory array circuitry, such as access devices (e.g., access transistors) coupled to the digit lines 208 (and word lines 210 (FIG. 2)) and storage node devices 211 (e.g., capacitors) of the memory cells 212 (e.g., DRAM cells). In additional embodiments, the control circuitry region 302 horizontally extends in the Y-direction beyond the horizontal area of the array region 202 into a horizontal area of the DL exit region 204 neighboring the array region 202. For example, the base structure 301 of the control circuitry structure 300 may horizontally extend in the Y-direction past the horizontal boundary of the additional base structure 201 of the memory array structure 200. An offset distance $D_4$, in the Y-direction, between a horizontal boundary of the base structure 301 of the control circuitry structure 300 and a respective horizontal boundary of the additional base structure 201 of the memory array structure 200 may be less than or equal to about 100 nanometers (nm), such as less than or equal to about 20 nm (e.g., within a range of from about 0 nm to about 20 nm). A horizontal area of the DL contact region 304 of the control circuitry structure 300 may be greater than, substantially equal to, or less than a horizontal area of the DL exit region 204 of the memory array structure 200. In some embodiments, the horizontal area of the DL contact region 304 of the control circuitry structure 300 is greater than the horizontal area of the DL exit region 204 of the memory array structure 200. A horizontal dimension, in the Y-direction, of the DL contact region 304 of the control circuitry structure 300 may, for example, be at least about 150 nm greater than a respective horizontal dimension, in the Y-direction, of the DL exit region 204 of the memory array structure 200.

Still referring to FIG. 6, since the DL contact region 304 of the control circuitry structure 300 horizontally overlaps the DL exit region 204 of the memory array structure 200, additional DL contact structures 314 of the control circuitry structure 300 may physically contact respective DL contact structures 214 of the memory array structure 200. The additional DL contact structures 314 may be coupled to the respective DL contact structures 214 without the use of additional conductive structures (e.g., conductive pad structures, conductive routing structures) extending from and between the DL contact structures 214 and the additional DL contact structures 314. A vertically lower end (e.g., vertically lower surface) of an individual additional DL contact structure 314 may at least partially horizontally overlap and physically contact and a vertically upper end (e.g., vertically upper surface) of a respective DL contact structure 214. In some embodiments, a horizontal area of the vertically lower end of the additional DL contact structure 314 is less than a horizontal area of the vertically upper end of the DL contact structure 214. A horizontal center of the additional DL contact structure 314 may be substantially aligned with a horizontal center of the DL contact structure 214, or the horizontal center of the additional DL contact structure 314 may be offset from the horizontal center of the DL contact structure 214. A shown in FIG. 6, in some embodiments, the horizontal center of an individual additional DL contact structure 314 is offset from the horizontal center of a respective additional DL contact structure 314 in physical contact therewith, and a horizontal boundary of an upper vertical end of the additional DL contact structure 314 is offset from a respective boundary of an upper vertical end of the DL contact structure 214 by an additional offset distance $D_5$. In some embodiments, the additional offset distance $D_5$ is less than or equal to about 20 nm, such as less than or equal to about 15 nm, or less than or equal to about 10 nm. In additional embodiments, at least one conductive structure (e.g., at least one conductive pad structures, at least one conductive routing structure) may be vertically interposed between at least one additional DL contact structure 314 and a respective at least one DL contact structure 214, and may be employed to couple the additional DL contact structure 314 to the DL contact structure 214. The additional DL contact structures 314 and the routing structures 315 may be formed before or after attaching (e.g., bonding) the control circuitry structure 300 to the memory array structure 200 at the interface 102. In some embodiments, the additional DL contact structures 314 and the routing structures 315 are formed after bonding the control circuitry structure 300 to the memory array structure 200.

With returned reference to FIG. 4, the column decoder sections 322 of the control circuitry structure 300 may horizontally neighbor respective SA sections 318 in the Y-direction, and may individually include column decoder devices and circuitry configured to select individual columns of memory cells 212 (FIG. 2) within the memory array structure 200 (FIG. 2) (e.g., for read operations, for write operations) during use and operation of the microelectronic device 100 (FIG. 1). The column decoder sections 322 may be substantially confined within horizontal areas of the control circuitry regions 302, and may individually be horizontally positioned, in the Y-direction, at or proximate a side (e.g., a horizontal boundary) of a respective SA section 318. An individual control circuitry region 302 (e.g., the first control circuitry region 302A, the second control circuitry region 302B, the third control circuitry region 302C, or the fourth control circuitry region 302D) may include two (2) column decoder sections 322 within a horizontal area thereof, wherein each of the two (2) column decoder sections 322 horizontally neighbors one (1) of the two (2) SA sections 318 within the horizontal area the control circuitry region 302.

The control circuitry regions 302 of the control circuitry structure 300 may individually further include additional control circuitry sections horizontally inward of the column decoder sections 322. The additional control circuitry sections may include additional control logic devices and circuitry for the microelectronic device 100. By way of non-limiting example, an individual control circuitry region 302 may further include one or more of global input/output (GIO) routing sections including GIO lines, data line SA (DLSA) sections including DLSA circuitry, and main word line driver (MWD) sections including MWD circuitry horizontally inward of the column decoder sections 322 within the horizontal area thereof.

Still referring to FIG. 4, the SWD sections 320 of the control circuitry structure 300 may include SWD circuitry and SWD devices of the microelectronic device 100 (FIG. 1) within horizontal areas thereof. The SWD sections 320 may horizontally overlap the WL contact regions 306 horizontally interposed, in the X-direction, between pairs of the control circuitry regions 302. An individual SWD section 320 may be substantially confined outside of horizontal areas of the control circuitry regions 302 horizontally proximate (e.g., directly horizontally adjacent in the X-direction) thereto. An individual SWD section 320 may be substantially confined within a horizontal area of an individual DL exit region 204 (FIG. 2) of the memory array structure 200 (FIG. 2). An individual SWD section 320 may horizontally extend, in the Y-direction, across a maximum horizontal dimension, in the Y-direction, of at least one (e.g., each) of the control circuitry regions 302 horizontally adjacent thereto in the X-direction.

A horizontal center of an individual SWD section 320 interposed, in the X-direction, between two (2) of the control circuitry regions 302 neighboring one another in the X-direction may be substantially aligned with a horizontal center of each of the two (2) control circuitry regions 302 in the Y-direction. For example, a SWD section 320 interposed, in the X-direction, between the first control circuitry region 302A and the third control circuitry region 302C may substantially aligned, in the Y-direction, with each of the first control circuitry region 302A and the third control circuitry region 302C. In addition, the SWD section 320 may be substantially aligned, in the X-direction, with another individual SWD section 320 interposed, in the X-direction, between two (2) other of the control circuitry regions 302 neighboring one another in the X-direction. For example, the SWD section 320 interposed between, in the X-direction, and substantially aligned with, in the Y-direction, the first control circuitry region 302A and the third control circuitry region 302C may be substantially aligned, in the X-direction, with another SWD section 320 interposed between, in the X-direction, and substantially aligned with, in the Y-direction, the second control circuitry region 302B and the fourth control circuitry region 302D.

The SWD sections 320 may include odd SWD sections 320A and even SWD sections 320B. The odd SWD sections 320A may horizontally alternate with the even SWD sections 320B in the X-direction. The odd SWD sections 320A may include odd SWD devices (but not even SWD devices) within horizontal areas thereof, and the even SWD sections 320B may include even SWD devices (but not odd SWD devices) within horizontal areas thereof. The odd SWD devices of the odd SWD sections 320A may be coupled to the odd word lines 210A (FIG. 2) of the memory array structure 200 (FIG. 2) by way of the odd additional routing structures 317A, the odd additional WL contact structures 316A, and the odd WL contact structures 216A (FIG. 2). The even SWD devices of the even SWD sections 320B may be coupled to the even word lines 210B (FIG. 2) of the memory array structure 200 (FIG. 2) by way of the even additional routing structures 317B, the even additional WL contact structures 316B, and the even WL contact structures 216B (FIG. 2). The odd SWD sections 320A may horizontally overlap and partially define the odd WL contact regions 306A, and the even SWD sections 320B may horizontally overlap and partially define the even WL contact regions 306B.

Still referring to FIG. 4, the MG regions 324 of the control circuitry structure 300 may individually include different conductive routing structures (e.g., control signal routing structures, column select routing structures, GIO routing structures, LIO routing structures, bussing routing structures) of the microelectronic device 100 (FIG. 1) within a horizontal area thereof. The MG regions 324 may individually be horizontally interposed, in the X-direction, between a respective two (2) of the SA sections 318 neighboring one another in the X-direction; and may also individually be horizontally interposed, in the Y-direction, between a respective two (2) of the SWD sections 320 neighboring one another in the X-direction. In some embodiments, a horizontal center, in the Y-direction, of an individual MG region 324 is substantially aligned with horizontal centers, in the Y-direction, of two (2) of the DL contact regions 304 most proximate thereto in the X-direction; and an horizontal center, in the X-direction, of the MG region 324 is substantially aligned with horizontal centers, in the Y-direction, of two (2) of the WL contact regions 306 most proximate thereto in the Y-direction. For an individual MG region 324, the conductive routing structures within a horizontal area thereof may individually horizontally extend (e.g., in the X-direction, in the Y-direction) through the MG region 324 en route to various control circuitry and devices of the control circuitry structure 300. Different conductive routing structures within horizontal areas of the MG regions 324 may be positioned at different vertical elevations (e.g., in the Z-direction) than one another.

With continued reference to FIG. 4, additional control circuitry regions of the control circuitry structure 300 may horizontally neighbor some of the control circuitry regions 302 and may include additional control circuitry, devices, and structures different than the control circuitry, devices, and structures positioned within the horizontal areas of the control circuitry regions 302 of the control circuitry structure 300. By way of non-limiting example, the additional control circuitry regions may include row decoder sections including row decoder devices; bank logic sections including bank logic devices; peripheral circuitry sections including various peripheral circuitry and devices; and/or package interface sections including structures and circuitry (e.g., BEOL structures and circuitry, such as bond pads and conductive routing). The additional control circuitry regions may horizontally neighbor one or more peripheral horizontal boundaries (e.g., in the Y-direction, in the X-direction) of one or more groups of the control circuitry regions 302, and may at least partially (e.g., substantially) horizontally overlap the additional regions (e.g., the one or more additional socket regions) of the memory array structure 200 (FIG. 2).

Thus, in accordance with embodiments of the disclosure, a microelectronic device includes a memory array structure and a control circuitry structure vertically overlying and bonded to the memory array structure. The memory array structure includes array regions respectively including memory cells, digit lines, and word lines within horizontal areas thereof. The control circuitry structure includes control circuitry regions, SA sections including SA circuitry, and SWD sections including SWD circuitry. The control circuitry regions horizontally overlap the array regions of the memory array structure. The SA sections respectively horizontally overlap each of two of the control circuitry regions horizontally neighboring one another in a first direction. The SWD sections are respectively interposed between two other of the control circuitry regions horizontally neighboring one another in a second direction orthogonal to the first direction.

Furthermore, in accordance with embodiments of the disclosure, a memory device includes a memory array structure and a control circuitry structure vertically overlying and bonded to the memory array structure. The memory array structure includes array regions, digit line exit regions, and word line exit regions. The array regions include memory cells, digit lines, and word lines. The digit line exit regions horizontally alternate with the array regions in a first direction and include horizontal ends of the digit lines within horizontal areas thereof. The word line exit regions horizontally alternate with the array regions in a second direction and include horizontal ends of the word lines within horizontal areas thereof. The control circuitry structure includes control circuitry regions, SA sections including SA devices, digit line contact regions, SWD sections including SWD devices, and word line contact regions. The control circuitry regions horizontally overlap the array regions of the memory array structure. The SA sections respectively horizontally overlap two of the control circuitry regions neighboring one another in the first direction. The digit line contact regions are within horizontal areas of the SA sections and horizontally overlap the digit line exit regions of the memory array structure. Horizontal areas of the digit line contact regions are defined by horizontally adjacent RW gap areas of pairs of the SA devices of the SA sections. The SWD sections are respectively horizontally interposed between two other of the control circuitry regions neighboring one another in the second direction. The word line contact regions are within horizontal areas of the SWD sections and horizontally overlap the word line exit regions of the memory array structure.

Figure 7:
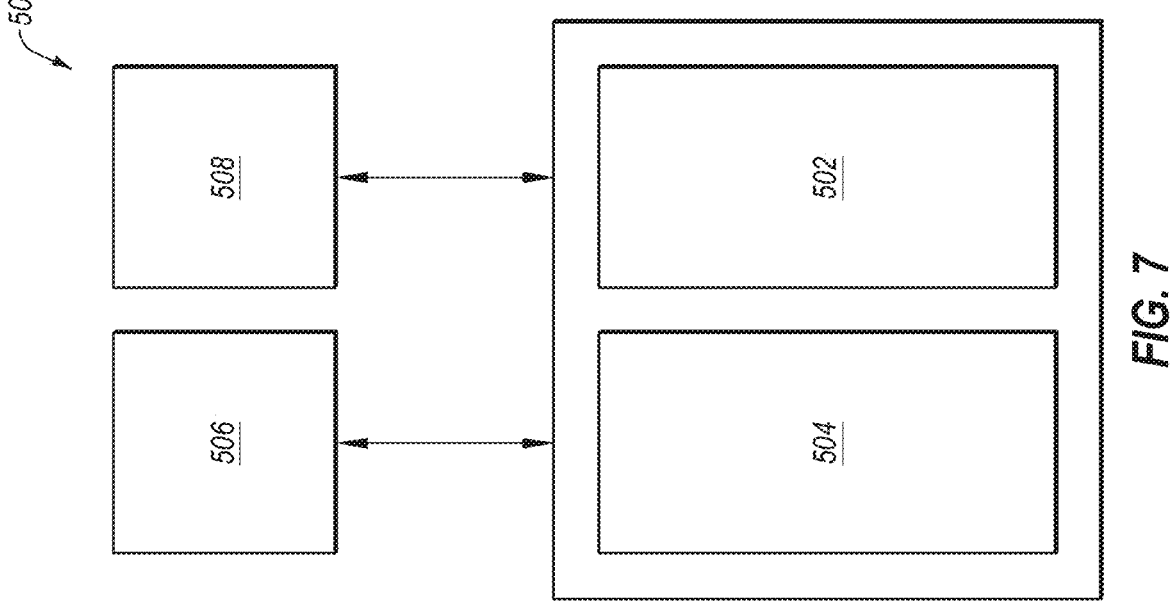
FIG. 7 is a simplified, schematic block diagram of an electronic system, in accordance with some embodiments of the disclosure.

Microelectronic devices (e.g., the microelectronic device 100) in accordance with embodiments of the disclosure may be used in embodiments of electronic systems of the disclosure. For example, FIG. 7 is a simplified, schematic block diagram illustrating an electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 500 includes at least one memory device 502. The memory device 502 may comprise, for example, a microelectronic device (e.g., the microelectronic device 100) previously described herein. The electronic system 500 may further include at least one electronic signal processor device 504 (often referred to as a "microprocessor"). The electronic signal processor device 504 may, optionally, comprise a microelectronic device (e.g., the microelectronic device 100) previously described herein. While the memory device 502 and the electronic signal processor device 504 are depicted as two (2) separate devices in FIG. 7, in additional embodiments, a single (e.g., only one) memory/processor device having the functionalities of the memory device 502 and the electronic signal processor device 504 is included in the electronic system 500. In such embodiments, the memory/processor device may include a microelectronic device (e.g., the microelectronic device 100) previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 comprise a single touchscreen device that can be used both to input information to the electronic system 500 and to output visual information to a user. The input device 506 and the output device 508 may communicate electrically with one or more of the memory device 502 and the electronic signal processor device 504.

Thus, in accordance with embodiments of the disclosure, an electronic system includes a processor device operably connected to an input device and an output device, and a memory device operably connected to the processor device. The memory device includes a memory array structure and a control circuitry structure vertically overlying and bonded to the memory array structure. The memory array structure includes array regions respectively including memory cells, digit lines, and word lines within horizontal areas thereof. The control circuitry structure includes control circuitry regions, SA sections including SA circuitry, digit line contact regions, SWD sections including SWD circuitry, and word line contact regions. The control circuitry regions horizontally overlap the array regions of the memory array structure. The SA sections respectively overlap two of the control circuitry regions neighboring one another in a first horizontal direction. The digit line contact regions are within horizontal areas of the SA sections and include conductive structures coupled to the SA circuitry and the digit lines. The SWD sections are respectively interposed between two other of the control circuitry regions neighboring one another in a second horizontal direction orthogonal to the first horizontal direction. The word line contact regions are within horizontal areas of the SWD sections and include additional conductive structures coupled to the SWD circuitry and the word lines.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
   a memory array structure comprising array regions respectively comprising memory cells, digit lines, and word lines within horizontal areas thereof; and
   a control circuitry structure vertically overlying and bonded to the memory array structure, the control circuitry structure comprising:
      control circuitry regions horizontally overlapping the array regions of the memory array structure;
      sense amplifier (SA) sections comprising SA circuitry, the SA sections respectively horizontally overlapping each of two of the control circuitry regions horizontally neighboring one another in a first direction; and
      sub-word line driver (SWD) sections comprising SWD circuitry, the SWD sections respectively interposed between two other of the control circuitry regions horizontally neighboring one another in a second direction orthogonal to the first direction.

2. The microelectronic device of claim 1, wherein the memory array structure further comprises:
   digit line exit regions alternating with the array regions in the first direction and respectively comprising:
      end portions of some of the digit lines; and
      digit line contacts coupled to the end portions of the some of the digit lines; and
   word line exit regions alternating with the array regions in the second direction and respectively comprising:
      end portions of some of the word lines; and
      word line contacts coupled to the end portions of the some of the word lines.

3. The microelectronic device of claim 2, wherein the control circuitry structure further comprises:
   digit line contact regions alternating with the control circuitry regions in the first direction and respectively comprising:
      additional digit line contacts coupled to the digit line contacts within a respective one of the digit line exit regions of the memory array structure; and routing structures coupled to the additional digit line contacts and to the SA circuitry of a respective one of the SA sections; and
word line contact regions alternating with the control circuitry regions in the second direction and respectively comprising:
   additional word line contacts coupled to the word line contacts within a respective one of the word line exit regions of the memory array structure; and
   additional routing structures coupled to the additional word line contacts and to the SWD circuitry of a respective one of the SWD sections.

4. The microelectronic device of claim 3, wherein:
   the digit line contact regions of the control circuitry structure horizontally overlap the digit line exit regions of the memory array structure; and
   the word line contact regions of the control circuitry structure horizontally overlap the word line exit regions of the memory array structure.

5. The microelectronic device of claim 4, wherein horizontal areas of the digit line contact regions of the control circuitry structure are greater than horizontal areas of the digit line exit regions of the memory array structure.

6. The microelectronic device of claim 4, wherein the additional digit line contacts within the digit line contact regions of the control circuitry structure physically contact the digit line contacts within the digit line exit regions of the memory array structure.

7. The microelectronic device of claim 3, wherein the SA sections of the control circuitry structure respectively horizontally overlap one of the digit line contact regions horizontally interposed in the first direction between the two of the control circuitry regions.

8. The microelectronic device of claim 3, wherein the SWD sections of the control circuitry structure are substantially confined within horizontal areas of word line exit regions of the memory array structure.

9. The microelectronic device of claim 3, wherein the digit line contact regions of the control circuitry structure comprise horizontally adjacent read/write (RW) gap areas of horizontally neighboring SA devices of the SA sections.

10. The microelectronic device of claim 1, wherein the control circuitry structure further comprises mini-gap (MG) sections respectively interposed between two of the SA sections horizontally neighboring one another in the second direction and two of the SWD sections horizontally neighboring one another in the first direction, the MG sections comprising routing structures operatively associated with the SA circuitry and the SWD circuitry.

11. A memory device, comprising:
   a memory array structure comprising:
      array regions comprising memory cells, digit lines, and word lines;
      digit line exit regions horizontally alternating with the array regions in a first direction and comprising horizontal ends of the digit lines within horizontal areas thereof; and
      word line exit regions horizontally alternating with the array regions in a second direction and comprising horizontal ends of the word lines within horizontal areas thereof;
   a control circuitry structure vertically overlying and bonded to the memory array structure, the control circuitry structure comprising:
      control circuitry regions horizontally overlapping the array regions of the memory array structure;

sense amplifier (SA) sections comprising SA devices, the SA sections respectively horizontally overlapping two of the control circuitry regions neighboring one another in the first direction;

digit line contact regions within horizontal areas of the SA sections and horizontally overlapping the digit line exit regions of the memory array structure, horizontal areas of the digit line contact regions defined by horizontally adjacent read/write (RW) gap areas of pairs of the SA devices of the SA sections;

sub-word line driver (SWD) sections comprising SWD devices, the SWD sections respectively horizontally interposed between two other of the control circuitry regions neighboring one another in the second direction; and word line contact regions within horizontal areas of the SWD sections and horizontally overlapping the word line exit regions of the memory array structure.

12. The memory device of claim 11, wherein the SA devices of the SA sections comprise voltage transfer characteristic (VTC) SA devices, each of the VTC SA devices comprising:

a RW gap area;

an N-type sense amplifier (NSA) area neighboring the RW gap area and including NSA circuitry;

a VTC area neighboring the NSA area and including VTC circuitry;

a P-type sense amplifier (PSA) area neighboring the VTC area and including PSA circuitry;

an additional VTC area neighboring the PSA area and including additional VTC circuitry;

an additional NSA area neighboring the additional VTC area and including additional NSA circuitry; and a column select (CS) area neighboring the additional NSA area and including CS circuitry.

13. The memory device of claim 11, wherein:

the digit lines of the memory array structure comprise:

odd digit lines; and even digit lines horizontally alternating with the odd digit lines in the second direction; and the SA sections of the control circuitry structure comprise:

odd SA sections comprising odd SA devices coupled to the odd digit lines; and even SA sections horizontally alternating with the odd SA sections in the first direction and comprising even SA devices coupled to the even digit lines.

14. The memory device of claim 13, wherein the digit line contact regions of the control circuitry structure comprise:

odd digit line contact regions within horizontal areas of the odd SA sections and comprising:

odd digit line contacts coupled to the odd digit lines; and odd digit line routing structures extending between and coupled to the odd digit line contacts and the odd SA devices of the odd SA sections; and even digit line contact regions within horizontal areas of the even SA sections and comprising:

even digit line contacts coupled to the even digit lines; and even digit line routing structures extending between and coupled to the even digit line contacts and the even SA devices of the even SA sections.

15. The memory device of claim 11, wherein:

the word lines of the memory array structure comprise:

odd word lines; and even word lines alternating with the odd word lines in the first direction; and the SWD sections of the control circuitry structure comprise:

odd SWD sections comprising odd SWD devices coupled to the odd word lines; and even SWD sections horizontally alternating with the odd SWD sections in the second direction and comprising even SWD devices coupled to the even word lines.

16. The memory device of claim 15, wherein the word line contact regions of the control circuitry structure comprise:

odd word line contact regions within horizontal areas of the odd SWD sections and comprising:

odd word line contacts coupled to the odd word lines; and odd word line routing structures extending between and coupled to the odd word line contacts and the odd SWD devices of the odd SWD sections; and even word line contact regions within horizontal areas of the even SWD sections and comprising:

even word line contacts coupled to the even word lines; and even word line routing structures extending between and coupled to the even word line contacts and the even SWD devices of the even SWD sections.

17. The memory device of claim 11, wherein each of the SWD sections of the control circuitry structure is substantially confined within a horizontal area of a respective one of the word line exit regions of the memory array structure.

18. The memory device of claim 11, wherein the control circuitry structure further comprises mini-gap (MG) sections respectively extending in the first direction between a horizontally neighboring pair of the SWD sections and respectively extending in the second direction between a horizontally neighboring pair of the SA sections, the MG sections respectively comprising:

conductive routing structures coupled to at least some of the SWD devices of the horizontally neighboring pair of the SWD sections; and additional conductive routing structures coupled to at least some of the SA devices of the horizontally neighboring pair of the SA sections.

19. An electronic system, comprising:

a processor device operably connected to an input device and an output device; and a memory device operably connected to the processor device and comprising:

a memory array structure comprising array regions respectively comprising memory cells, digit lines, and word lines within horizontal areas thereof; and a control circuitry structure vertically overlying and bonded to the memory array structure, the control circuitry structure comprising:

control circuitry regions horizontally overlapping the array regions of the memory array structure;

sense amplifier (SA) sections comprising SA circuitry, the SA sections respectively overlapping two of the control circuitry regions neighboring one another in a first horizontal direction;

digit line contact regions within horizontal areas of the SA sections and comprising conductive structures coupled to the SA circuitry and the digit lines;

sub-word line driver (SWD) sections comprising SWD circuitry, the SWD sections respectively interposed between two other of the control cir-
cuitry regions neighboring one another in a second
horizontal direction orthogonal to the first hori-
zontal direction; and word line contact regions within horizontal areas of 5
the SWD sections and comprising additional con-
ductive structures coupled to the SWD circuitry
and the word lines.

20. The electronic system of claim 19, wherein the
memory cells comprise dynamic random access memory 10
(DRAM) cells.

\* \* \* \* \*